US011056634B1

(12) United States Patent
Lutchyn et al.

(10) Patent No.: US 11,056,634 B1
(45) Date of Patent: Jul. 6, 2021

(54) JOSEPHSON MAGNETIC MEMORY WITH A SEMICONDUCTOR-BASED MAGNETIC SPIN VALVE

(71) Applicant: Microsoft Technology Licensing, LLC, Redmond, WA (US)

(72) Inventors: Roman Lutchyn, Santa Barbara, CA (US); Andrey Antipov, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 18 days.

(21) Appl. No.: 16/715,004

(22) Filed: Dec. 16, 2019

(51) Int. Cl.
*H01L 39/02* (2006.01)
*H01L 39/12* (2006.01)
(Continued)

(52) U.S. Cl.
CPC ............ *H01L 39/025* (2013.01); *H01L 39/12* (2013.01); *H01L 39/223* (2013.01); *H01L 43/02* (2013.01); *H01L 43/10* (2013.01)

(58) Field of Classification Search
CPC ..... H01L 43/08; H01L 39/025; H01L 39/223; H01L 39/12; H01L 43/02; H01L 43/10; G11C 2211/5615; G11C 11/161
See application file for complete search history.

(56) References Cited

U.S. PATENT DOCUMENTS

| 9,520,181 B1 | 12/2016 | Miller et al. | |
|---|---|---|---|
| 2002/0084453 A1* | 7/2002 | Bozovic | H01L 39/228 257/35 |
| 2012/0184445 A1 | 7/2012 | Mukhanov et al. | |

FOREIGN PATENT DOCUMENTS

| EP | 3505490 A1 | 7/2019 |
|---|---|---|
| WO | 2017091258 A3 | 8/2017 |

OTHER PUBLICATIONS

Blümel, et al., "Growth-Mode Investigation of Epitaxial EuS on InAs(100)", in AIP Advances, vol. 9, No. 3, Mar. 13, 2019, 6 Pages.
Ke, et al., "Ballistic Superconductivity and Tunable-Junctions in InSb Quantum Wells", Retrieved from https://arxiv.org/pdf/1902.10742.pdf, Feb. 27, 2019, 13 Pages.
(Continued)

*Primary Examiner* — Scott B Geyer
(74) *Attorney, Agent, or Firm* — Ranjeev Singh; Singh Law, PLLC

(57) ABSTRACT

Josephson magnetic memory cells with a semiconductor-based magnetic spin valve are described. An example memory cell includes a first superconducting electrode, a second superconducting electrode, and a semiconductor-based magnetic spin valve arranged between the two superconducting electrodes. The semiconductor-based magnetic spin valve includes a semiconductor layer and a first ferromagnetic insulator arranged near the semiconductor layer, arranged on a first side of the semiconductor layer, configured to provide a fixed magnetization oriented in a first direction. The semiconductor-based magnetic spin valve further includes a second ferromagnetic insulator, arranged on a second side, opposite to the first side, of the semiconductor layer, configured to provide a free magnetization oriented in the first direction or a second direction, opposite to the first direction, in order to control a parameter associated with a flow of current from the first superconducting electrode to the second superconducting electrode through the semiconductor layer.

20 Claims, 9 Drawing Sheets

(51) Int. Cl.
*H01L 43/02* (2006.01)
*H01L 43/10* (2006.01)
*H01L 39/22* (2006.01)

(56) References Cited

OTHER PUBLICATIONS

Strambini, et al., "Revealing the Magnetic Proximity Effect in EuS/Al Bilayers Through Superconducting Tunneling Spectroscopy", in Physical Review Materials, vol. 1, Issue 5, Oct. 2017, 9 Pages.

"International Search Report and Written Opinion issued in PCT Application No. PCT/US20/058894", dated Feb. 10, 2021, 26 pages.

* cited by examiner

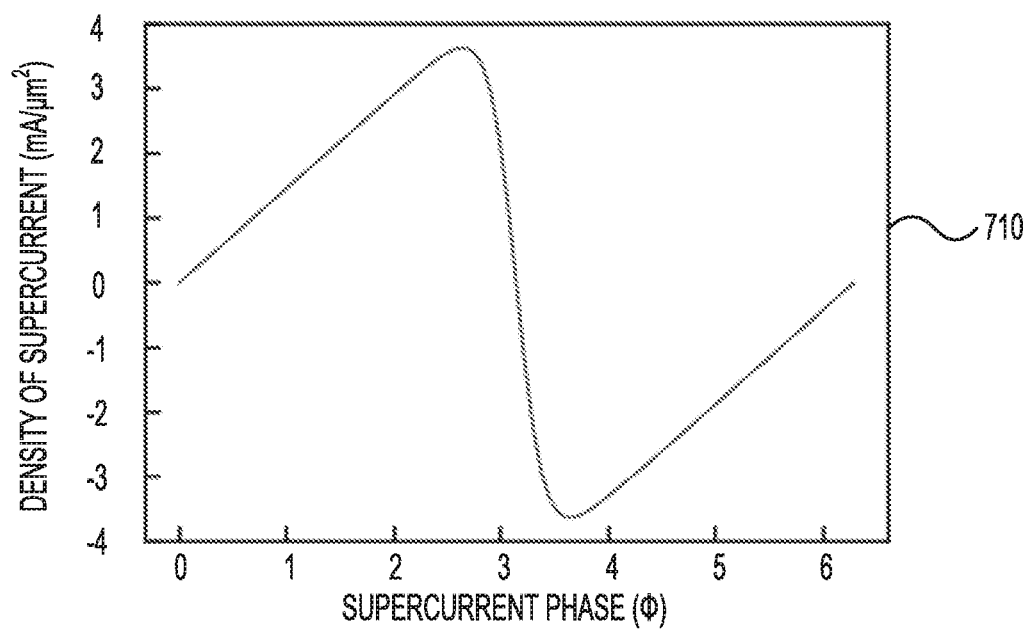
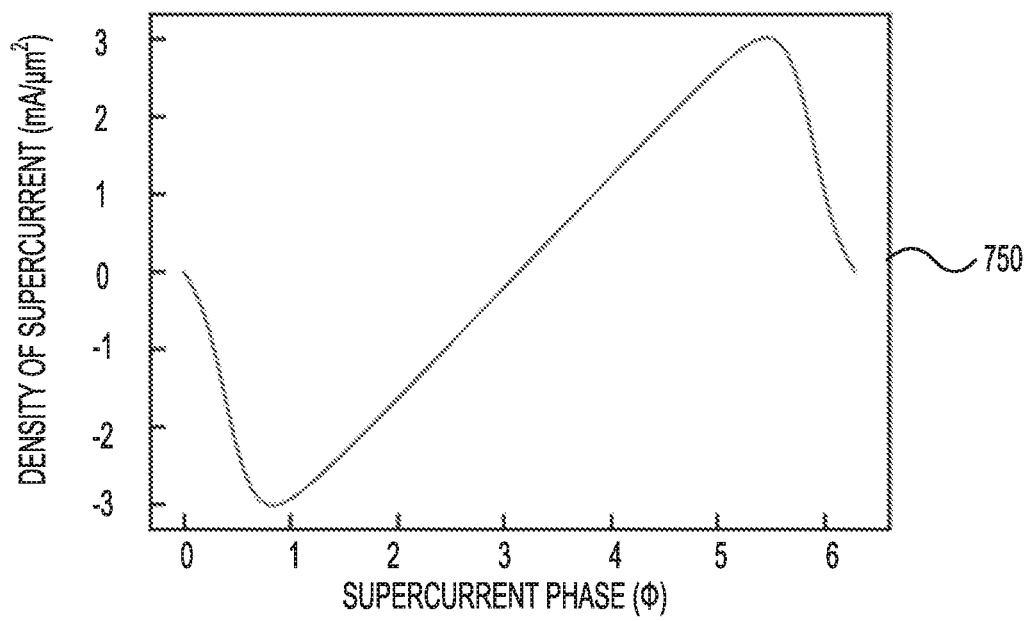
FIG. 7

JOSEPHSON MAGNETIC MEMORY WITH A SEMICONDUCTOR-BASED MAGNETIC SPIN VALVE

BACKGROUND

Semiconductor based integrated circuits used in electronic devices, such as random-access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based memory is the Josephson magnetic memory.

SUMMARY

In one example, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged near the semiconductor layer, where the first ferromagnetic insulator is arranged on a first side of the semiconductor layer, and where the first ferromagnetic insulator is configured to provide a fixed magnetization oriented in a first direction. The semiconductor-based magnetic spin valve may further comprise a second ferromagnetic insulator arranged near the semiconductor layer, where the second ferromagnetic insulator is arranged on a second side, opposite to the first side, of the semiconductor layer, and where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer.

In another aspect, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged on at least a first side of the semiconductor layer, and where the first ferromagnetic insulator is configured to provide a fixed magnetization oriented in a first direction. The semiconductor-based magnetic spin valve may further comprise a second ferromagnetic insulator arranged on at least a second side, opposite to the first side, of the semiconductor layer, and where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer. The semiconductor-based magnetic spin valve may further comprise a control gate, arranged on top of the semiconductor layer, between the first ferromagnetic insulator and the second ferromagnetic insulator, configured to control a coupling between the first ferromagnetic insulator and the second ferromagnetic insulator.

In yet another aspect, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged on at least a first side of the semiconductor layer, where the first ferromagnetic insulator is configured to provide a fixed magnetization oriented in a first direction. The semiconductor-based magnetic spin valve may further comprise a second ferromagnetic insulator arranged on at least a second of the semiconductor layer, opposite to the first side, of the semiconductor layer, where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer. The semiconductor-based magnetic spin valve may further comprise a first control gate configured to control a coupling between the first ferromagnetic insulator and the second ferromagnetic insulator. The semiconductor-based magnetic spin valve may further comprise a second control gate configured to control a carrier density of the semiconductor layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 7 shows the density of supercurrent flowing through the semiconductor layer in accordance with another example;

DETAILED DESCRIPTION

Examples described in this disclosure relate to superconducting logic-based memory systems, including a memory with a semiconductor-based magnetic spin valve. Certain examples also relate to Josephson Magnetic Random-Access Memories (JMRAMs) with a semiconductor-based magnetic spin valve. Unlike CMOS transistors, superconducting devices use Josephson junction based devices.

Various superconducting circuits, including transmission lines, can be formed by coupling multiple Josephson junctions by inductors or other components, as needed. Single flux quantum (SFQ) pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line.

Microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cell. As an example, the state of such a memory cell may be read out using a superconducting quantum interference device (SQUID). The memory cell circuit may include a SQUID and a semiconductor-based magnetic spin valve device.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

Figure 1:
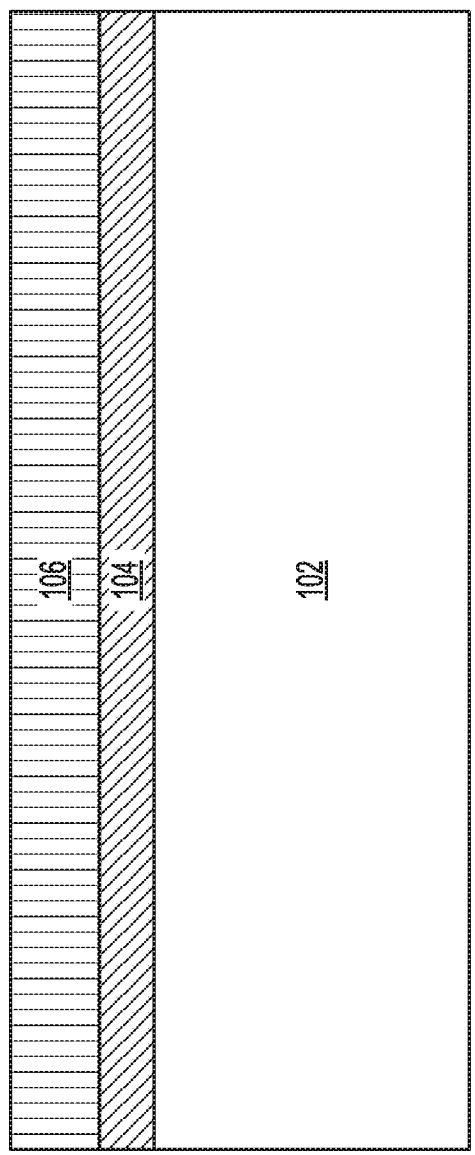
FIG. 1 shows a cross-section view of an example memory cell during manufacturing.

FIG. 1 shows a cross-section view of an example memory cell 100 during manufacturing. In this example, as part of this step, starting with a substrate 102, a buffer layer 104 may be formed. In this example, substrate 102 may be an indium phosphide (InP) substrate. Buffer layer 104 may be an indium gallium arsenide (InGaAs) layer. Next, a semiconductor layer 106 may be formed on top buffer layer 104. Semiconductor layer 106 may comprise gallium arsenide (GaAs) or indium arsenide (InAs). Semiconductor layer 106 may also comprise indium antimonide (InSb). In addition, semiconductor layer 106 may also be a ternary alloy including a combination of any of these materials (e.g., GaAsSb and InAsSb). Each of these layers may be formed using molecular-beam epitaxy (MBE). As an example, the MBE related process may be performed in an MBE system that allows the deposition of the appropriate materials in a vacuum. Although FIG. 1 shows a certain number of layers of memory cell 100 arranged in a certain manner, there could be more or fewer numbers of layers arranged differently.

Figure 2:
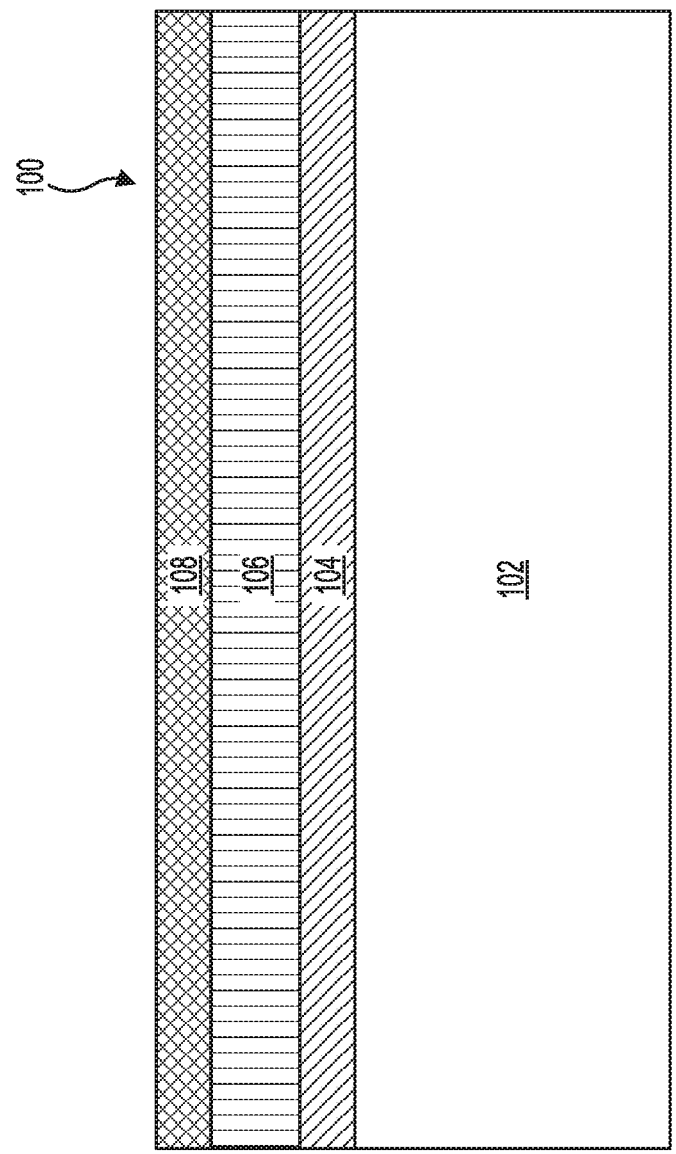
FIG. 2 shows a cross-section view of an example memory cell during manufacturing.

FIG. 2 shows a cross-section view of an example memory cell 100 during manufacturing. In this example, as part of this step, a dielectric layer 108 may be formed on top of semiconductor layer 106. Dielectric layer 108 may comprise any suitable dielectric, including oxide-based dielectrics. Although FIG. 2 shows a certain number of layers of memory cell 100 arranged in a certain manner, there could be more or fewer numbers of layers arranged differently.

Figure 3:
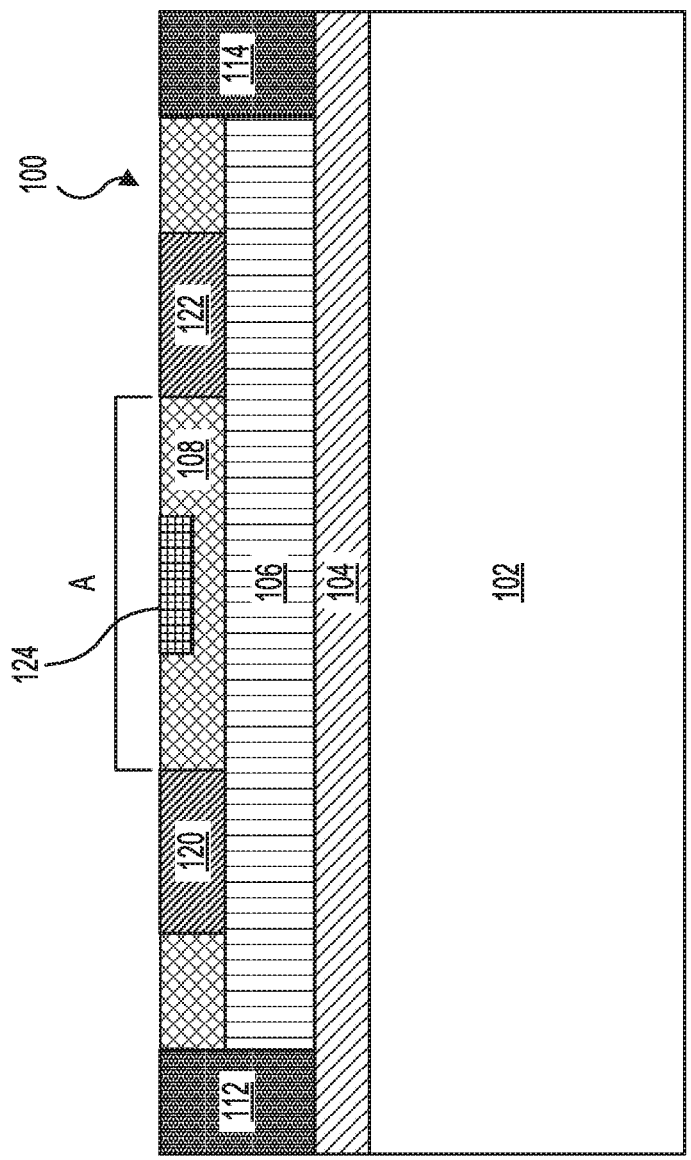
FIG. 3 shows a cross-section view of an example memory cell during manufacturing.

FIG. 3 shows a cross-section view of an example memory cell during manufacturing. In this example, as part of this step, which may include several sub-steps, a superconducting electrode 112 and another superconducting electrode 114 may be formed. As shown in FIG. 3, superconducting electrode 112 and superconducting electrode 114 may be formed such that during operation of memory cell 100, a current may flow from superconducting electrode 112 to superconducting electrode 114 through semiconductor layer 106. The current may flow in an opposite direction, as well. In this example, superconducting electrode 112 and superconducting electrode 114 may be formed by using masks and photolithography-based manufacturing techniques. Thus, as needed, semiconductor layer 106 and dielectric layer 108 may be etched to define areas in which the electrodes may be formed. In this example, superconducting electrode 112 and superconducting electrode 114 may comprise a superconducting metal, such as niobium. Other niobium alloys, such as niobium-titanium-nitride (NbTiN) may also be used.

With continued reference to FIG. 3, dielectric layer 108 may further be processed to form a ferromagnetic insulator 120 and another ferromagnetic insulator 122. In one example, each of ferromagnetic insulator 120 and ferromagnetic insulator 122 may comprise europium sulfide (EuS). In another example, each of ferromagnetic insulator 120 and ferromagnetic insulator 122 may comprise europium oxide (EuO). Ferromagnetic insulator 120 may be spaced at a selected distance (e.g., shown as A in FIG. 3) from ferromagnetic insulator 122. The amount of the selected distance (A) may be chosen to control the coupling between ferromagnetic insulator 120 and ferromagnetic insulator 122. Although ferromagnetic insulator 120 and ferromagnetic insulator 122 are shown as formed on top of semiconductor layer 106, they could be formed elsewhere as long as they are near semiconductor layer 106. As used in this disclosure, the term "near" includes the arrangement of ferromagnetic insulators on top of semiconductor layer 106 as shown in FIG. 3. This term, however, is not limited to just this example. As long as ferromagnetic insulators are arranged in a manner that they can affect the phase of the supercurrent flowing through semiconductor layer 106, they are arranged "near" semiconductor layer 106.

Still referring to FIG. 3, as part of memory cell 100, a control gate 124 may be formed. Control gate 124 may comprise a suitable metal or a suitable stack of layers. Example metals include aluminum, copper, titanium, or other metals. In this example, control gate 124 may be configured to control the coupling, through the electrons in semiconductor layer 106, between ferromagnetic insulator 120 and ferromagnetic insulator 122. The coupling may be controlled by applying a certain voltage via control gate 124. In one example, while it may be important to minimize energy consumption, the coupling between ferromagnetic insulator 120 and ferromagnetic insulator 122 needs to be weak enough such that uncontrolled state changes do not occur. Thus, if there is some magnetic moment interruption between the two ferromagnets, control gate 124 may minimize it so that the memory cell is stable (e.g., the memory cell state does not flip by itself, but at the same time the supercurrent that is flowing through semiconductor layer 106 can be different enough to distinguish the difference in magnetization). The application of the voltage via control gate 124 may be selected to achieve these objectives. This is because an application of the voltage via gate 124 may affect the charge carriers in semiconductor layer 106. In addition, as noted above the distance between the ferromagnetic insulators may be selected to further control the coupling between the ferromagnetic insulators. Although FIG. 3 shows a certain number of layers of memory cell 100 arranged in a certain manner, there could be more or fewer numbers of layers arranged differently. In addition, the layers and other features of memory cell 100 may be formed in a different order. As an example, dielectric layer 108 may be deposited after the formation of ferromagnetic insulator 120 and ferromagnetic insulator 122, and then control gate 124 may be formed.

Figure 4:
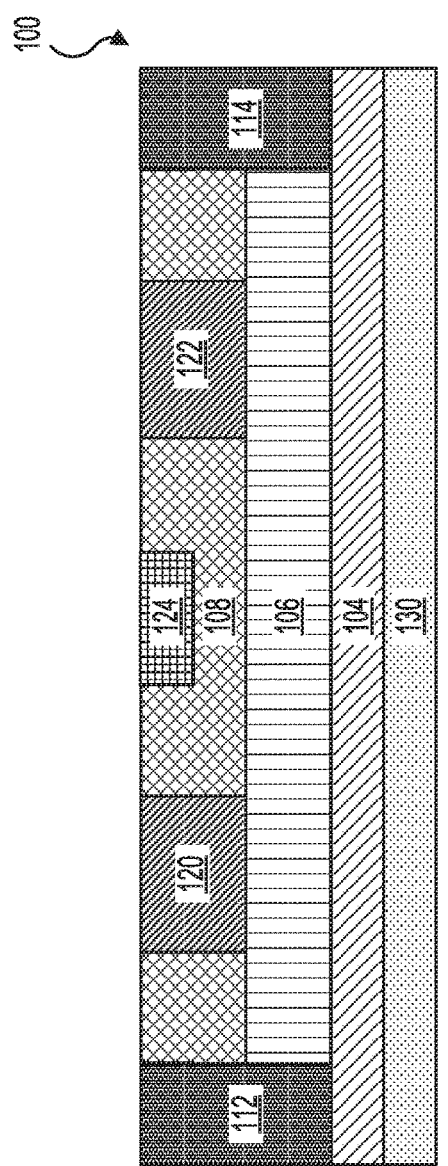
FIG. 4 shows a cross-section view of an example memory cell during manufacturing.

FIG. 4 shows a cross-section view of an example memory cell 100 during manufacturing. In this example, as part of this step a back-gate 130 may be formed. In this example, back-gate 130 may be formed using a part of substrate 102. Thus, as an example, a portion of substrate 102 with an appropriate doping may serve as back-gate 130. In another example, back-gate 130 may comprise a metal alloy or a metal, such as aluminum, niobium, or copper. Back-gate 130 may also comprise a stack including multiple layers. In a yet another example, back-gate 130 may be a doped portion of semiconductor layer 106. In one example, back-gate 130 may act as another control gate for memory device 100. Thus, application of a voltage to back-gate 130 may control a density of carriers in semiconductor layer 106. Although FIG. 4 shows a certain number of layers of memory cell 100 arranged in a certain manner, there could be more or fewer numbers of layers arranged differently. As an example, memory cell 100 may not include control gate 124. This is because the coupling between the ferromagnetic insulators may be controlled by spacing them apart as described earlier. As another example, memory cell 100 may not include back-gate 130. This is because the density of carriers in semiconductor layer 106 may be controlled by controlling the doping in the stack of the layers used to form memory cell 100.

Figure 5:
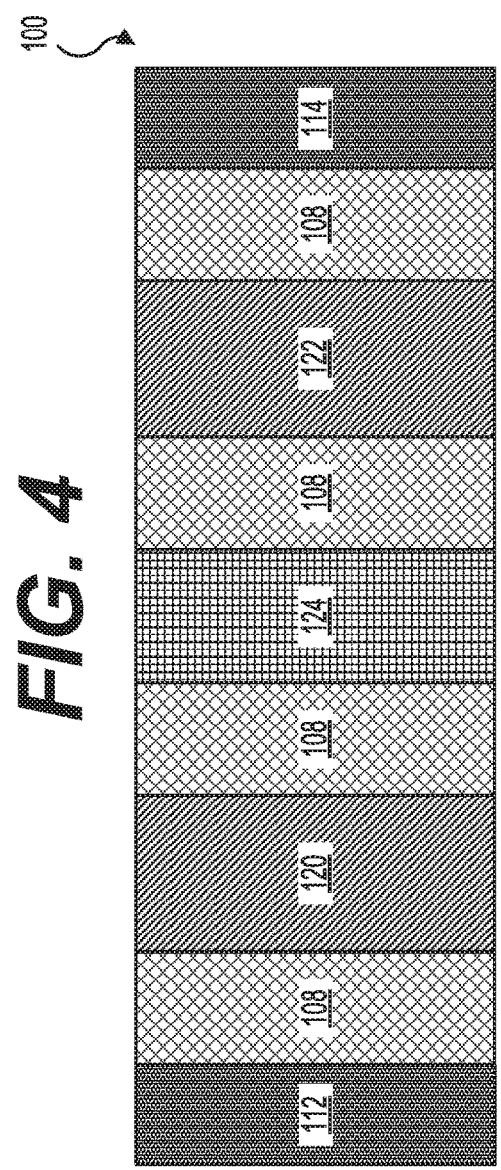
FIG. 5 shows a top view of an example memory cell during manufacturing.

FIG. 5 shows a top view of an example memory cell 100 during manufacturing. In this example, the top view shows an example arrangement, including superconducting electrode 112, superconducting electrode 114, dielectric layer 108, ferromagnetic insulator 120, ferromagnetic insulator 122, and control gate 124. Although FIG. 5 shows a certain number of layers of memory cell 100 arranged in a certain manner, there could be more or fewer numbers of layers arranged differently. As an example, these layers and components need not be formed in a planar arrangement.

In terms of the operation of memory cell 100, electrons in semiconductor layer 106 may carry supercurrent, which may experience magnetization, and the phase that is accumulated during the transport may be added when the magnetization of each of the two ferromagnetic insulators (e.g., ferromagnetic insulator 120 and ferromagnetic insulator 122) is in the same direction (e.g., parallel to each other). Alternatively, when the magnetization of each of the two ferromagnetic insulators (e.g., ferromagnetic insulator 120 and ferromagnetic insulator 122) is in the opposite direction (e.g., anti-parallel to each other), the phase may be canceled out. In memory cell 100, no supercurrent flows through the ferromagnetic insulators (e.g., ferromagnetic insulator 120 and ferromagnetic insulator 122).

Figure 6:
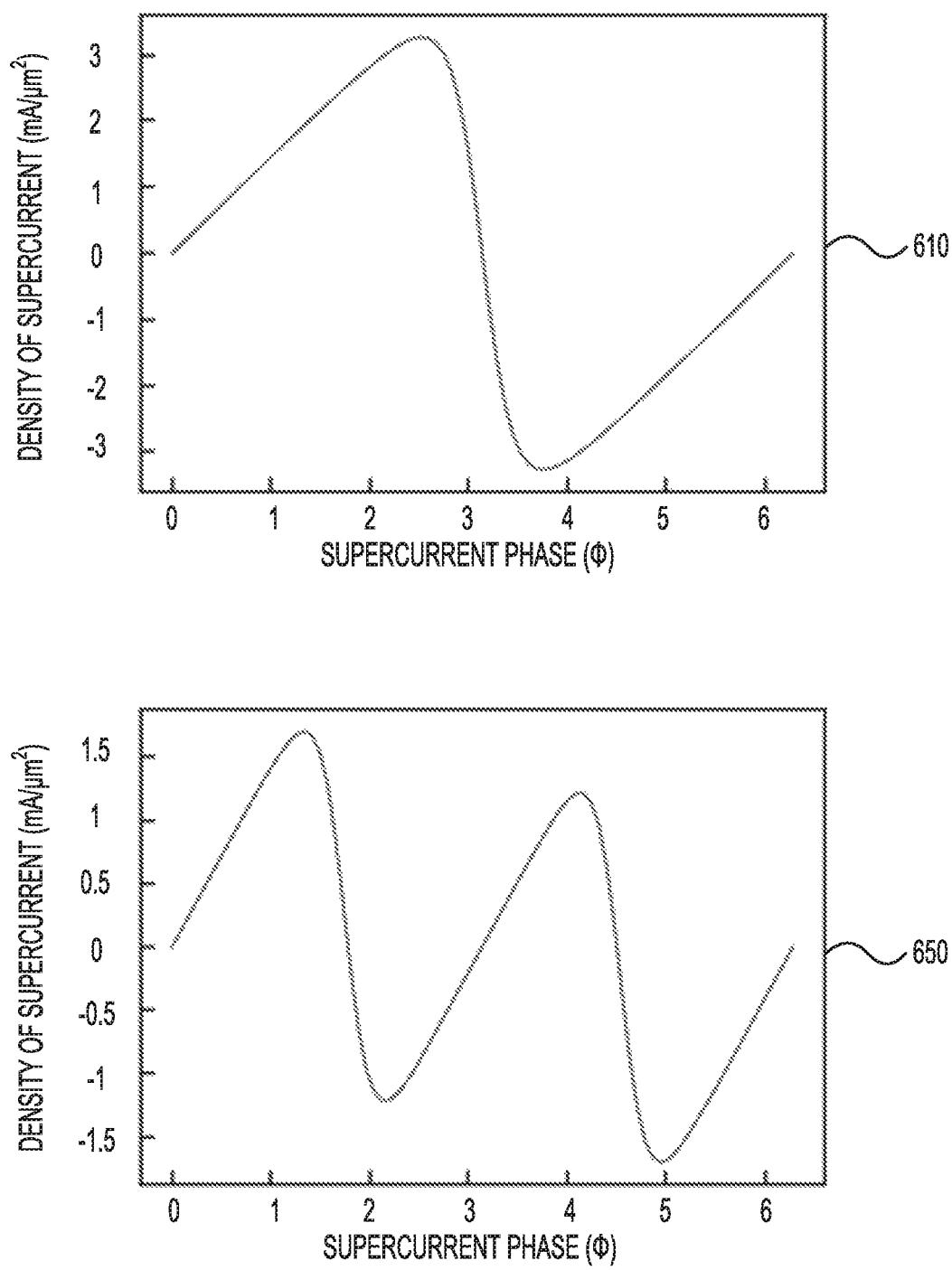
FIG. 6 shows the density of supercurrent flowing through the semiconductor layer in accordance with one example.

FIG. 6 shows the relationship between the density of supercurrent flowing through semiconductor layer 106 and the phase of the supercurrent depending on whether the magnetization of the ferromagnetic insulators is parallel or anti-parallel. Graph 610 shows the relationship between the density of supercurrent (mA/μm$^2$) and the superconducting phase ($\phi$) when the magnetization of the ferromagnetic insulators is parallel. Graph 650 shows the relationship between the density of supercurrent (mA/μm$^2$) and the superconducting phase ($\phi$) when the magnetization of the ferromagnetic insulators is anti-parallel. As shown via graphs 610 and 650, the magnitude of the supercurrent is lower for certain superconducting phase ($\phi$) values when the magnetization of the ferromagnetic insulators is parallel as opposed to anti-parallel. Similarly, the sign associated with the current is different for the same phase values. Each of these parameters can be controlled to effect a change in a state of memory cell 100.

FIG. 7 shows the relationship between the density of supercurrent flowing through semiconductor layer 106 and the phase of the supercurrent depending on whether the magnetization of the ferromagnetic insulators is parallel or anti-parallel. FIG. 7 corresponds to the junction behavior, Graph 710 shows the relationship between the density of supercurrent (mA/μm$^2$) and the superconducting phase ($\phi$) when the magnetization of the ferromagnetic insulators is parallel, Graph 750 shows the relationship between the density of supercurrent (mA/μm$^2$) and the superconducting phase ($\phi$) when the magnetization of the ferromagnetic insulators is anti-parallel. As shown via graphs 710 and 750, the magnitude of the supercurrent is lower for certain superconducting phase ($\phi$) values when the magnetization of the ferromagnetic insulators is parallel as opposed to anti-parallel. Similarly, the sign associated with the current is different for certain phase values. Each of these parameters can be controlled to effect a change in a state of memory cell 100. The strength of the coupling to the ferromagnetic insulators is weaker in the graph shown in FIG. 6 relative to the strength of the coupling to the ferromagnetic insulators in the graph shown in FIG. 7. Accordingly, in the parallel configuration, the amplitude of the supercurrent exceeds in the graph shown in FIG. 7 relative to the graph shown in FIG. 6.

Advantageously; example memory cell 100 includes only two materials to form the Josephson junctions, resulting in fewer interfaces that may adversely affect the operation of memory cell 100. Traditional JMRAM memory cells, however, may include several interfaces—for example, an interface between niobium and copper and another interface between copper and iron or nickel. Each of these interfaces may change the properties of the signal traveling across these interfaces. In addition; in traditional JMRAM memory cells, Josephson junctions may use copper as a spacer, which in some instances may cause strong spin orbit coupling, causing spin-orbit physics related issues. Memory cell 100, however, does not include such copper-induced spin-orbit physics related issues. Moreover, the ferromagnetic domains in ferromagnetic insulators, such as EuS, are quite large and thus any pernicious effects of multi-domain physics are removed. This is because in typical ferromagnets there are several magnetic domains that interfere with each other causing multi-domain effects.

In addition, electrons corresponding to the supercurrent may be affected in a manner that suppresses the supercurrent based on the electrons that are diffusing through the ferromagnets. In memory cell 100, however, the motion of the electrons through superconductor layer 106 is ballistic, rather than diffusive, and thus the transport of the supercurrent is more manageable. The trajectories in the ballistic transport are simple—the trajectories are essentially straight trajectories from one lead to another lead, and thus it is easier to understand and optimize the stack with ballistic transport. However, in case of diffusive transport, the trajectories are complicated. Electrons diffuse throughout the structure carrying the electrons and their different trajectories cancel out the signals; thus, the supercurrent in such structures decays very fast. As a result, one can control the amount of disorder in semiconductors, resulting in a clean stack with ballistic transport. In contrast, in metallic junctions the disorder is intrinsic and is not as controllable (e.g., even using a control gate).

In addition, as described, during manufacturing of the memory cell, high-quality stacks of materials can be grown using molecular beam epitaxy (MBE) that are less susceptible to even weak disorder. The stack that is grown using MBE allows for a high degree of control over every layer of deposition. In addition, the stack has a small number of interfaces (e.g., only two interfaces), compared to devices formed using the sputtering technology, where deposition of every new material changes the property of the stack. Moreover, the semiconductor part of the system (with the deposited ferromagnetic insulators) can be separately characterized using manufacturing techniques. In addition, memory cell 100 has a highly tunable coupling between the ferromagnetic insulators and the supercurrent, which allows for optimizing the operating regime of memory cell 100. As explained earlier in relation to memory cell 100, using proper spacing and a control gate, the coupling between the magnetic valves can be optimized.

Figure 8:
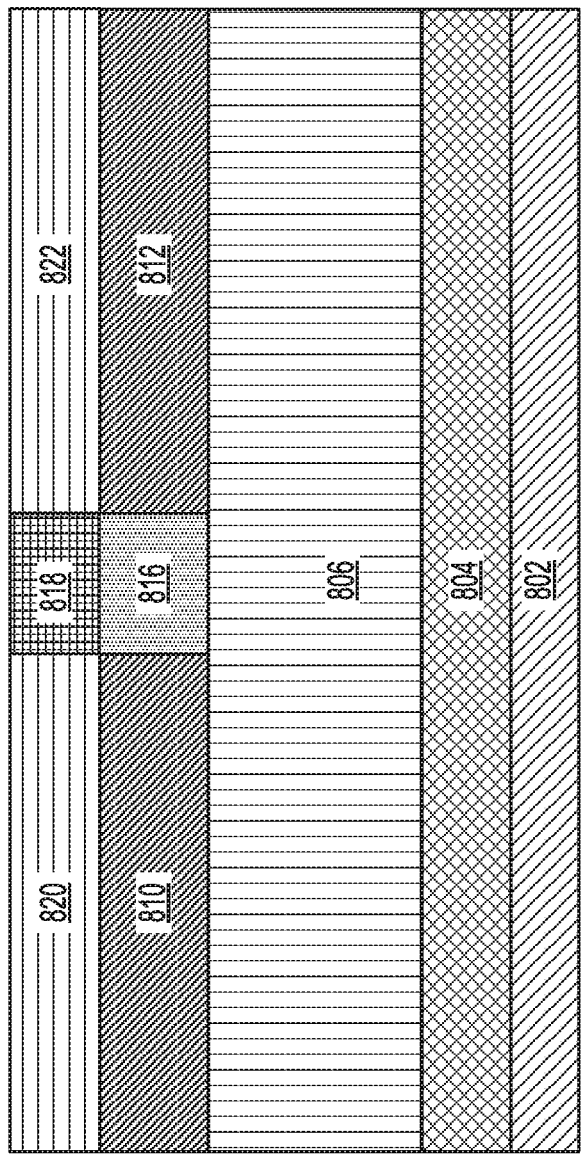
FIG. 8 shows a cross-section view of another example memory cell during manufacturing.

FIG. 8 shows a cross-section view of another example memory cell 800 during manufacturing. The various layers and other parts of memory cell 800 may be formed using a similar process as described earlier with respect to FIGS. 1-5. Memory cell 800 may include a back-gate 802, a dielectric layer 804, a superconductor layer 806, a ferromagnetic insulator 810, another ferromagnetic insulator 812, gate dielectric 816, control gate 818, left gate 820, and right gate 822. Thus, memory cell 800 may include additional gates left gate 820 and right gate 822. Each of these gates may be configured as electrostatic gates. Application of voltages to these gates may be structured to allow a single transmitting channel through semiconductor layer 806. In one example, semiconductor layer 806 may be a gallium arsenide (GaAs) wire with a 10 nm thickness. In this example, semiconductor layer 806 may have an approximately 50 nm to 100 nm long boundary with each of the ferromagnetic insulators. The spin-valve junction may be 20 nm to 50 nm long. Although FIG. 8 shows a certain number of layers of memory cell 800 arranged in a certain manner, there could be more or fewer numbers of layers arranged differently.

In terms of the operation of memory cell 800, it may operate in a similar fashion to memory cell 100, as explained earlier with respect to FIG. 6 and FIG. 7. Electrons in semiconductor layer 806 may carry supercurrent, which may experience magnetization, and the phase that is accumulated during the transport may be added when the magnetization of each of the two ferromagnetic insulators (e.g., ferromagnetic insulator 810 and ferromagnetic insulator 812) is in the same direction (e.g., parallel to each other). Alternatively, when the magnetization of each of the two ferromagnetic insulators (e.g., ferromagnetic insulator 810 and ferromagnetic insulator 812) is in the opposite direction (e.g., anti-parallel to each other), the phase may be canceled out. The variation in the magnitude and the phase of the supercurrent may be similar to as explained earlier with respect to FIG. 6 and FIG. 7. In sum, the proximity effect to magnetic insulator controls both the amplitude and the phase of the supercurrent depending on the strength of the magnetic splitting (e.g., Zeeman induced splitting) and the geometry of the memory cell. In the example memory cells, the proximity effect is the effect which appears at the interface of two materials—the superconducting electrodes and the semiconductor layer. The semiconductor layer being proximate to the superconducting electrodes will inherit some of the properties of superconductor because electrons can tunnel into superconductor for a short amount of time and sense the correlations present in that material, Thus, there is proximity induced superconductivity in the semiconductor layer associated with the memory cells. Electrons from the semiconductor layer tunnel for a short amount of time into the ferromagnetic insulators and experience the magnetic correlation.

Figure 9:
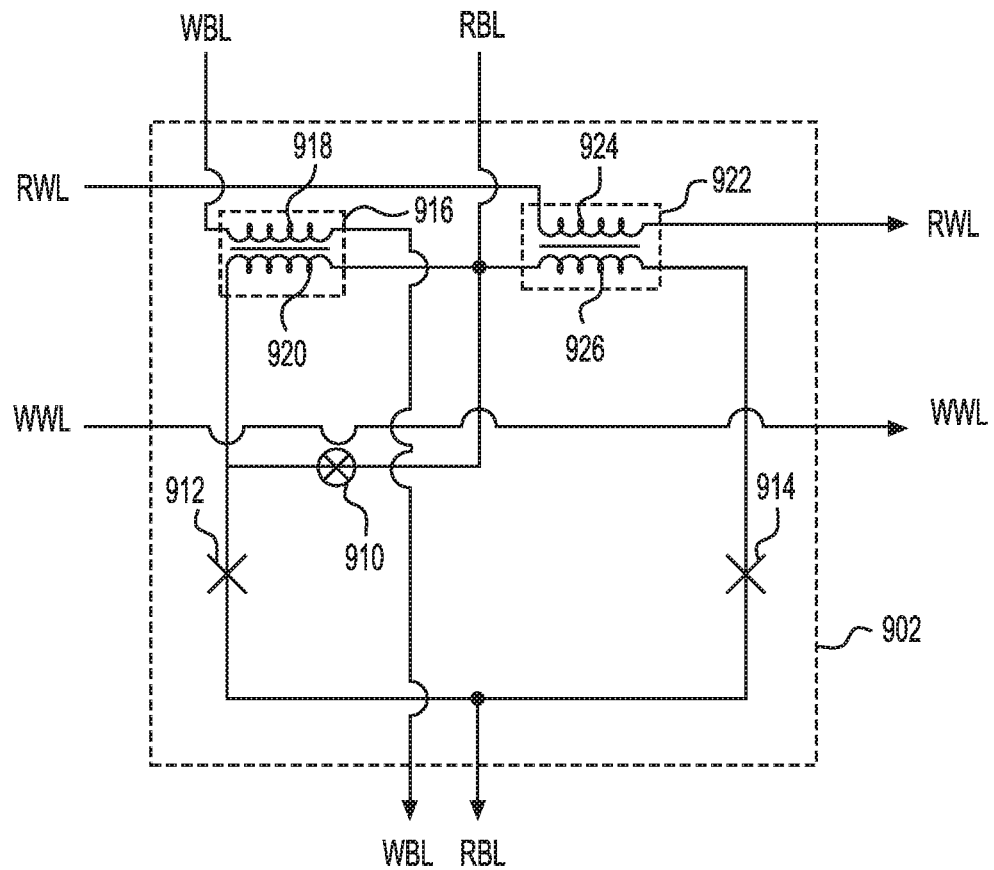
FIG. 9 shows a memory cell circuit in accordance with one example.

FIG. 9 shows a diagram of a memory cell circuit 900 in accordance with one example. In one example, memory cell circuit 900 may include a memory storage element 902 including at least one memory cell device 910 (e.g., memory cell 100 or memory cell 700) and at least two Josephson junctions 912 and 914 as shown in FIG. 9. Memory storage element 902 may further include a transformer 916. Transformer 916 may include two inductors 918 and 920, Memory storage element 902 may further include another transformer 922. Transformer 922 may include inductors 924 and 926. In one example, Josephson junctions 912 and 914 may form a readout superconducting quantum interference device (SQUID).

With continued reference to FIG. 9, memory cell circuit 900 may be coupled to word-lines and bit-lines for performing various memory operations, including, for example, read and write operations. As an example, a read word-line (RWL) for performing a read operation may be coupled to memory cell circuit 900. In this example, the read word-line (RWL) may be coupled via transformer 922. A write word-line (VVWL) for performing a write operation may be coupled to memory cell circuit 900. The write word-line may be magnetically coupled to memory cell device 910. In addition, a read bit-line (RBL) for performing a read operation may be coupled to memory cell circuit 900. A write bit-line (WBL) for performing a write operation may also be coupled to memory cell circuit 900. In this example, the write bit-line (WBL) may be coupled via transformer 916. Memory cell device 910 may be used as a control mechanism for changing the state of memory cell circuit 900. In one example, the coupling with memory cell device 910 may be such that the magnetization of the ferromagnetic insulators can be changed by the application of a local write word-line current and by the application of a write bit-line current.

In one example, memory cell device 910 may be in a first state (e.g., corresponding to when the magnetization provided by the ferromagnetic insulator is parallel) and a second state (e.g., corresponding to when the magnetization provided by the ferromagnetic insulator is anti-parallel). In at least one of these states, memory cell device 910 may apply flux to JJs 912 and 914 such that under the application of a word read current, the induced currents in memory storage element 902, due to the flux generated by memory cell device 910 and by the coupling of the word-read current via transformer 922, may combine with the applied bit-read current to trigger the Josephson junctions 912 and 914, sending a readout SQUID into voltage state. This voltage may generate a current along the read bit-line, which may act as a transmission line with a certain impedance. This current may be sensed using a sense amplifier. In one example, the presence or absence of a current pulse, once amplified by the sense amplifier, may determine the state of memory cell circuit 900 as logic low or logic high.

In one example, during a write operation, the write word-line (WL) and the write bit-line (WBL) may receive current from the respective drivers. By embedding the magnetic junction in a SQUID loop and applying flux to the loop via a superconducting transformer (e.g., via transformer 916 in FIG. 9), the magnitude or the sign of the supercurrent through memory cell device 910 can be controlled and can be used to effect magnetic switching. Although FIG. 9 shows a certain number of components arranged in a certain manner, memory cell circuit 900 may include additional or fewer components arranged differently.

Figure 10:
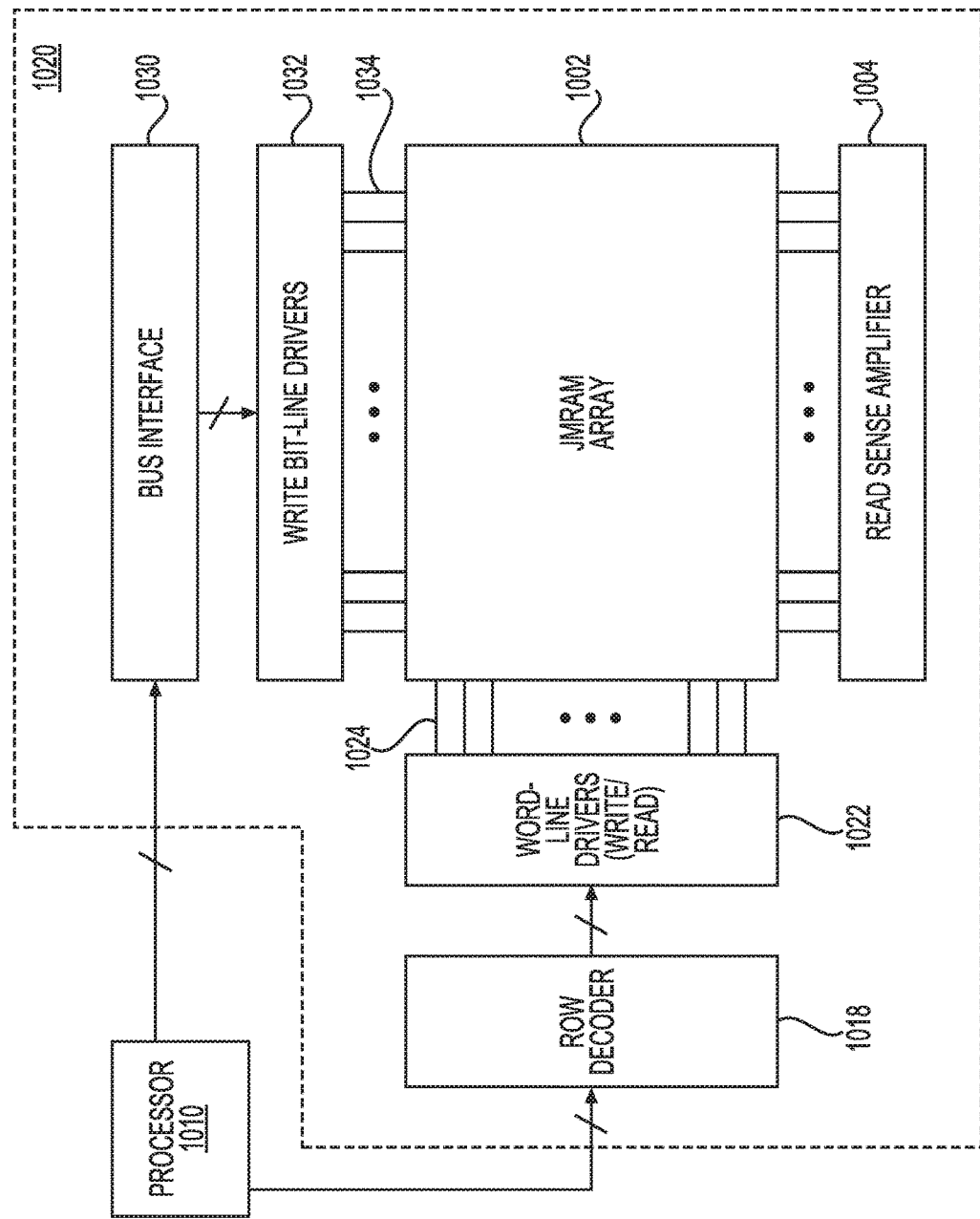
FIG. 10 shows a computing system including a memory, coupled to a processor, in accordance with one example.

FIG. 10 shows a computing system 100 including a memory 1020, coupled to a processor 1010, in accordance with one example. Processor 1010 may perform read or write operations on memory 1020 in a manner as explained earlier. Memory 1020 may be used as part of storage in a data center for delivering cloud-based services, such as software as a service, platform as a service, or other services. Memory system 1020 may include an array 1002 of JMRAM memory cells arranged in rows and columns. In one example, array 1002 may be an array of memory cell circuits, e.g., memory cell circuit 900. Memory system 1020 may further include a row decoder 1018 that may be configured to decode row control/address signals. Row decoder 1018 may further be coupled to word-line drivers 1022. Word-line drivers 1022 may include circuitry to provide word-line read/write current to a subset or all of the memory cells associated with a selected word-line for any read or write operations. Word-line drivers 1022 may provide such current via word-lines 1024.

Memory system 1020 may further include bus interface 1030 that may be configured to receive control signals or other signals from processor 1010. Bus interface 1030 may further be coupled to bit-line drivers 1032. Bit-line drivers 1032 may include circuitry to provide bit-line read current to a subset or all of the memory cells associated with a selected bit-line for any read or write operations. Bit-line drivers 1032 may provide such current via bit-lines 1034. Bit-lines 1034 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 1034) may further be coupled to sense amplifier 1004 for sensing bit-lines to determine the logical state of each of the array 1002 of memory cells. Although FIG. 10 shows a certain number of components of computing system 1000 arranged in a certain manner, there could be more or fewer number of components arranged differently.

In conclusion, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged near the semiconductor layer, where the first ferromagnetic insulator is arranged on a first side of the semiconductor layer, and where the first ferromagnetic insulator is configured to provide a fixed magnetization oriented in a first direction. The semiconductor-based magnetic spin valve may further comprise a second ferromagnetic insulator arranged near the semiconductor layer, where the second ferromagnetic insulator is arranged on a second side, opposite to the first side, of the semiconductor layer, and where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer.

The parameter associated with the flow of the current from the first superconducting electrode to the second superconducting electrode through the semiconductor layer may comprise a direction of the flow of the current or a magnitude of the flow of the current. The parameter associated with the flow of the current from the first superconducting electrode to the second superconducting electrode through the semiconductor layer may comprise a magnitude of the flow of the current.

Each of the first ferromagnetic insulator and the second ferromagnetic insulator may comprise europium sulfide or europium oxide. Each of the first superconducting electrode and the second superconducting electrode may comprise niobium.

The semiconductor layer may comprise gallium arsenide, indium arsenide, or indium antimonids. The memory cell may be configured to be in a logic high state or a logic low state, and the semiconductor-based magnetic spin valve may be configured to be in a 0 state or a π state in both logic states of the memory cell.

In another aspect, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged on at least a first side of the semiconductor layer, and where the first ferromagnetic insulator is configured to provide a fixed magnetization oriented in a first direction. The semiconductor-based magnetic spin valve may further comprise a second ferromagnetic insulator arranged on at least a second side, opposite to the first side, of the semiconductor layer, and where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer. The semiconductor-based magnetic spin valve may further comprise a control gate, arranged on top of the semiconductor layer, between the first ferromagnetic insulator and the second ferromagnetic insulator, configured to control a coupling between the first ferromagnetic insulator and the second ferromagnetic insulator.

The parameter associated with the flow of the current from the first superconducting electrode to the second superconducting electrode through the semiconductor layer may comprise a direction of the flow of the current or a magnitude of the flow of the current. The parameter associated with the flow of the current from the first superconducting electrode to the second superconducting electrode through the semiconductor layer may comprise a magnitude of the flow of the current.

Each of the first ferromagnetic insulator and the second ferromagnetic insulator may comprise europium sulfide or europium oxide. Each of the first superconducting electrode and the second superconducting electrode may comprise niobium.

The semiconductor layer may comprise gallium arsenide, indium arsenide, or indium antimonids. The memory cell may be configured to be in a logic high state or a logic low state, and the semiconductor-based magnetic spin valve may be configured to be in a 0 state or a u state in both logic states of the memory cell.

In yet another aspect, the present disclosure relates to a memory cell including a first superconducting electrode. The memory cell may further include a second superconducting electrode. The memory cell may further include a semiconductor-based magnetic spin valve coupled to the first superconducting electrode and the second superconducting electrode. The semiconductor-based magnetic spin valve may comprise a semiconductor layer arranged between the first superconducting electrode and the second superconducting electrode. The semiconductor-based magnetic spin valve may further comprise a first ferromagnetic insulator arranged on at least a first side of the semiconductor layer, where the first ferromagnetic insulator is configured to provide a fixed magnetization oriented in a first direction. The semiconductor-based magnetic spin valve may further comprise a second ferromagnetic insulator arranged on at least a second of the semiconductor layer, opposite to the first side, of the semiconductor layer, where the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer. The semiconductor-based magnetic spin valve may further comprise a first control gate configured to control a coupling between the first ferromagnetic insulator and the second ferromagnetic insulator. The semiconductor-based magnetic spin valve may further comprise a second control gate configured to control a carrier density of the semiconductor layer.

The parameter associated with the flow of the current from the first superconducting electrode to the second superconducting electrode through the semiconductor layer may comprise a direction of the flow of the current or a magnitude of the flow of the current. The parameter associated with the flow of the current from the first superconducting electrode to the second superconducting electrode through the semiconductor layer may comprise a magnitude of the flow of the current, and the second control gate may further be configured to control the magnitude of the flow of the current.

The first ferromagnetic insulator may be spaced at a selected distance from the second ferromagnetic insulator, and the selected distance may be chosen to control the coupling between the first ferromagnetic insulator and the second ferromagnetic insulator. The memory cell may further include a third control gate coupled to the first ferromagnetic insulator and a fourth control gate coupled to the second ferromagnetic insulator, where each of the third control gate and the fourth control gate may be configured to control a carrier density proximate to the semiconductor layer. The memory cell may be configured to be in a logic high state or a logic low state, and the semiconductor-based magnetic spin valve may be configured to be in a 0 state or a TT state in both logic states of the memory cell.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media may include non-volatile media and/or volatile media. Non-volatile media may include, for example, a hard disk, a solid state drive, a magnetic disk or tape, an optical disk or tape, a flash memory, an EPROM, NVRAM, PRAM, or other such media, or networked versions of such media. Volatile media may include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media may include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate spatial, temporal, or other prioritization of such elements.

What is claimed:

1. A memory cell comprising:
   a first superconducting electrode;
   a second superconducting electrode; and
   a semiconductor-based magnetic spin valve coupled to the first superconducting electrode and the second superconducting electrode, wherein the semiconductor-based magnetic spin valve comprises:
   a semiconductor layer arranged between the first superconducting electrode and the second superconducting electrode,
   a first ferromagnetic insulator arranged near the semiconductor layer, wherein the first ferromagnetic insulator is arranged on a first side of the semiconductor layer, and wherein the first ferromagnetic insulator is configured to provide a fixed magnetization oriented in a first direction, and
   a second ferromagnetic insulator arranged near the semiconductor layer, wherein the second ferromagnetic insulator is arranged on a second side, opposite to the first side, of the semiconductor layer, and wherein the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer.

2. The memory cell of claim 1, wherein the parameter associated with the flow of the current from the first superconducting electrode to the second superconducting electrode through the semiconductor layer comprises a direction of the flow of the current or a magnitude of the flow of the current.

3. The memory cell of claim 1, wherein the parameter associated with the flow of the current from the first superconducting electrode to the second superconducting electrode through the semiconductor layer comprises a magnitude of the flow of the current.

4. The memory cell of claim 1, wherein each of the first ferromagnetic insulator and the second ferromagnetic insulator comprises europium sulfide or europium oxide.

5. The memory cell of claim 1, wherein each of the first superconducting electrode and the second superconducting electrode comprises niobium.

6. The memory cell of claim 1, wherein the semiconductor layer comprises gallium arsenide, indium arsenide, or indium antimonids.

7. The memory cell of claim 1, wherein the memory cell is configured to be in a logic high state or a logic low state, and wherein the semiconductor-based magnetic spin valve is configured to be in a 0 state or a $\pi$ state in both logic states of the memory cell.

8. A memory cell comprising:
   a first superconducting electrode;
   a second superconducting electrode; and
   a semiconductor-based magnetic spin valve coupled to the first superconducting electrode and the second superconducting electrode, wherein the semiconductor-based magnetic spin valve comprises:
   a semiconductor layer arranged between the first superconducting electrode and the second superconducting electrode,
   a first ferromagnetic insulator arranged on at least a first side of the semiconductor layer, wherein the first ferromagnetic insulator is configured to provide a fixed magnetization oriented in a first direction,
   a second ferromagnetic insulator arranged on at least a second side, opposite to the first side, of the semiconductor layer, wherein the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer, and
   a control gate, arranged on top of the semiconductor layer, between the first ferromagnetic insulator and the second ferromagnetic insulator, configured to control a coupling between the first ferromagnetic insulator and the second ferromagnetic insulator.

9. The memory cell of claim 8, wherein the parameter associated with the flow of the current from the first superconducting electrode to the second superconducting electrode through the semiconductor layer comprises a direction of the flow of the current or a magnitude of the flow of the current.

10. The memory cell of claim 8, wherein the parameter associated with the flow of the current from the first superconducting electrode to the second superconducting electrode through the semiconductor layer comprises a magnitude of the flow of the current.

11. The memory cell of claim 8, wherein each of the first ferromagnetic insulator and the second ferromagnetic insulator comprises europium sulfide or europium oxide.

12. The memory cell of claim 8, wherein each of the first superconducting electrode and the second superconducting electrode comprises niobium.

13. The memory cell of claim 8, wherein the semiconductor layer comprises gallium arsenide, indium arsenide, or indium antimonide.

14. The memory cell of claim 8, wherein the memory cell is configured to be in a logic high state or a logic low state, and wherein the semiconductor-based magnetic spin valve is configured to be in a 0 state or a $\pi$ state in both logic states of the memory cell.

15. A memory cell comprising:
a first superconducting electrode;
a second superconducting electrode; and
a semiconductor-based magnetic spin valve coupled to the first superconducting electrode and the second superconducting electrode, wherein the semiconductor-based magnetic spin valve comprises:
a semiconductor layer arranged between the first superconducting electrode and the second superconducting electrode,
a first ferromagnetic insulator arranged on at least a first side of the semiconductor layer, wherein the first ferromagnetic insulator is configured to provide a fixed magnetization oriented in a first direction,
a second ferromagnetic insulator arranged on at least a second side, opposite to the first side, of the semiconductor layer, wherein the second ferromagnetic insulator is configured to provide a free magnetization oriented in the first direction or a second direction, opposite to the first direction, in order to control a parameter associated with a flow of current from the first superconducting electrode to the second superconducting electrode through the semiconductor layer,
a first control gate configured to control a coupling between the first ferromagnetic insulator and the second ferromagnetic insulator, and
a second control gate configured to control a carrier density of the semiconductor layer.

16. The memory cell of claim 15, wherein the parameter associated with the flow of the current from the first superconducting electrode to the second superconducting electrode through the semiconductor layer comprises a direction of the flow of the current or a magnitude of the flow of the current.

17. The memory cell of claim 15, wherein the parameter associated with the flow of the current from the first superconducting electrode to the second superconducting electrode through the semiconductor layer comprises a magnitude of the flow of the current, and wherein the second control gate is further configured to control the magnitude of the flow of the current.

18. The memory cell of claim 15, wherein the first ferromagnetic insulator is spaced at a selected distance from the second ferromagnetic insulator, and wherein the selected distance is chosen to control the coupling between the first ferromagnetic insulator and the second ferromagnetic insulator.

19. The memory cell of claim 15 further comprises a third control gate coupled to the first ferromagnetic insulator and a fourth control gate coupled to the second ferromagnetic insulator, wherein each of the third control gate and the fourth control gate is configured to control a carrier density proximate to the semiconductor layer.

20. The memory cell of claim 15, wherein the memory cell is configured to be in a logic high state or a logic low state, and wherein the semiconductor-based magnetic spin valve is configured to be in a 0 state or a $\pi$ state in both logic states of the memory cell.

* * * * *